United States Patent
Yoshihara

(10) Patent No.: US 11,629,237 B2
(45) Date of Patent: Apr. 18, 2023

(54) SOLVENT COMPOSITION AND PRODUCTION METHOD THEREFOR

(71) Applicant: KANEKA CORPORATION, Osaka (JP)

(72) Inventor: Shusuke Yoshihara, Hyogo (JP)

(73) Assignee: KANEKA CORPORATION, Osaka (JP)

( * ) Notice: Subject to any disclaimer, the term of this patent is extended or adjusted under 35 U.S.C. 154(b) by 558 days.

(21) Appl. No.: 16/688,209

(22) Filed: Nov. 19, 2019

(65) Prior Publication Data

US 2020/0095385 A1 Mar. 26, 2020

Related U.S. Application Data

(63) Continuation of application No. PCT/JP2018/018109, filed on May 10, 2018.

(30) Foreign Application Priority Data

May 19, 2017 (JP) .............................. JP2017-099852

(51) Int. Cl.
| | |
|---|---|
| *C08J 3/09* | (2006.01) |
| *C08J 5/24* | (2006.01) |
| *C08L 33/10* | (2006.01) |
| *C08L 83/04* | (2006.01) |
| *C08L 25/04* | (2006.01) |
| *C08F 22/40* | (2006.01) |
| *C08F 20/06* | (2006.01) |
| *C08F 12/08* | (2006.01) |

(52) U.S. Cl.
CPC .............. *C08J 3/095* (2013.01); *C08F 12/08* (2013.01); *C08F 20/06* (2013.01); *C08F 22/40* (2013.01); *C08J 3/092* (2013.01); *C08J 5/244* (2021.05); *C08J 5/249* (2021.05); *C08L 25/04* (2013.01); *C08L 33/10* (2013.01); *C08L 83/04* (2013.01); *C08L 2203/206* (2013.01); *C08L 2207/53* (2013.01)

(58) Field of Classification Search
CPC .... C08J 3/095; C08J 5/24; C08J 3/092; C08F 22/40; C08F 12/08; C08F 20/06; C08L 33/10; C08L 83/04; C08L 25/04; C08L 2203/206; C08L 2207/53
See application file for complete search history.

(56) References Cited

FOREIGN PATENT DOCUMENTS

| | | |
|---|---|---|
| JP | 2003-221546 A | 8/2003 |
| JP | 2009-67891 A | 4/2009 |
| JP | 2015-534591 A | 12/2015 |
| WO | 2014/039063 A1 | 3/2014 |
| WO | WO-2014039063 A1 * | 3/2014 .............. C08J 3/005 |

OTHER PUBLICATIONS

International Search Report issued in International Application No. PCT/JP2018/018109, dated Jul. 31, 2018 (3 pages).
Written Opinion issued in International Application No. PCT/JP2018/018109, dated Jul. 31, 2018 (6 pages).

* cited by examiner

*Primary Examiner* — Robert D Harlan
(74) *Attorney, Agent, or Firm* — Osha Bergman Watanabe & Burton LLP

(57) ABSTRACT

A solvent composition includes an organic solvent including one or more organic solvents (A) and one or more organic solvents (B), and one or more types of core-shell polymer particles each comprising a core layer and a shell layer. The organic sol vents (A) have a polar teen δp of a Hansen solubility parameter of less than 11 and a hydrogen bond term δh of less than 10, and the organic solvents (B) satisfy at least one of 11 or more of the polar term δp or 10 or more of the hydrogen bond term δh. A weight ratio of (A) to (B) ranges from 15:85 to 95:5. Based on a total weight of the solvent composition, a content of the core-shell polymer particles is 20 to 40% by weight and a water content is 1% by weight or less.

14 Claims, No Drawings

SOLVENT COMPOSITION AND PRODUCTION METHOD THEREFOR

TECHNICAL FIELD

One or more embodiments of the present invention relate to a solvent composition containing core-shell polymer particles and a method for producing the solvent composition.

BACKGROUND

Core-shell polymer particles are widely known as a material for improving impact resistance of plastics. In addition to various insulating film forming materials such as printed wiring hoards, copper-clad laminated plates, and resist materials, build-up materials, prepreg materials, and adhesives for FPCs used therein, availability of the core-shell polymer particles has been increased also in general paints.

For example, in printed wiring boards, high heat resistance of materials is required due to the use of lead-free solder and an increase in the operating temperature of electronic equipment, while a resin matrix with excellent thermal stability is brittle. When the resin is brittle, it may cause defects such as cracks and delamination in drilling for forming a through hole in the printed wiring hoard. In addition, brittle printed wiring boards are prone to wear and break drill bits. In view of the above, an additive capable of tough toughening a resin has been demanded. In paints, there is a high demand for additives that can increase toughness in order to improve chipping strength and reduce a frequency of repair of painting.

As such an additive for toughening a resin, a solvent composition in which core-shell polymer particles are uniformly dispersed in a solvent is useful. For example, PTL 1 discloses a master blend containing a solvent and core-shell rubber. However, there is no description of a solvent species for stably dispersing the core-shell rubber at a high concentration. The combination of a certain type of solvent and the core-shell rubber has a disadvantage that the core-shell rubber swells excessively in the solvent and the master blend thickens, and the usable core-shell rubber is limited.

In addition, studies have been made to increase affinity between particles and the solvent for the purpose of increasing dispersibility of the fine particles in the solvent and reducing viscosity of a dispersion. However, regarding the core-shell polymer particles, the higher the affinity with the solvent, the greater the swelling of the core-shell polymer particles in the solvent, and therefore, the volume of the particles increases, and conversely the viscosity of the dispersion increases.

CITATION LIST

Patent Literature

PTL 1: JP-A No. 2015-534591

SUMMARY

One or more embodiments of the present invention provide a low viscosity solvent composition in which core-shell polymer particles are stably dispersed at a high concentration in an organic solvent, and a method for producing the solvent composition.

As a result of intensive studies, the present inventors have found that swelling of core-shell polymer particles due to a low/medium polar solvent, which is a solvent having a high affinity with the core-shell polymer panicles, and thickening due to the swelling are suppressed by mixing a suitable amount of a high polar solvent, and while the core-shell polymer particles are stably dispersed at a high concentration in an organic solvent, a low viscosity solvent composition is provided, thereby arriving at one or more embodiments of the present invention. That is, one or more embodiments of the present invention have the following configurations 1) to 48).

1) A solvent composition including:
   an organic solvent containing, in a weight ratio of 15:85 to 95:5, one or more organic solvents (A) having a polar term $\delta p$ of a Hansen solubility parameter of less than 11 and a hydrogen bond term $\delta h$ of less than 10 and one or more organic solvents (B) satisfying at least one of 11 or more of the polar term $\delta p$ and 10 or more of the hydrogen bond term $\delta h$; and
   one or more types of core-shell polymer particles,
   in which a content of the core-shell polymer particles is 20 to 40% by weight based on a total weight of the solvent composition.

2) The solvent composition according to 1) above, in which
   the organic solvent (A) is one or more solvents selected from the group consisting of toluene, xylene, ethyl acetate, propylene glycol monomethyl ether acetate, acetone, methyl ethyl ketone, methyl isobutyl ketone, and cyclohexanone, and
   the organic solvent (B) is one or more solvents selected from the group consisting of butanol, methyl cellosolve, butyl cellosolve, propylene glycol monomethyl ether, dimethylformamide, dimethylacetamide, dimethyl sulfoxide, and N-methyl-2-pyrrolidone.

3) The solvent composition according to 1) or 2) above, in which the core-shell polymer particles in the solvent composition have a volume average particle size of 10 nm to 500 nm.

4) The solvent composition according to any one of 1) to 3) above, in which a core layer of the core-shell polymer particles includes
   (i) a rubber elastic body formed from 50% by weight or more and 100% by weight or less of one or more monomers selected from the group consisting of diene monomers and (meth)acrylic ester monomer and less than 50% by weight of other copolymerizable vinyl monomer: (ii) a polysiloxane rubber-based elastic body,
   (iii) an aromatic vinyl crosslinked body, or
   (iv) a mixture of two or more of (i) to (iii) above, and
   the other copolymerizable vinyl monomer is one or more selected from the group consisting of an aromatic vinyl compound, a vinyl cyanide compound, an unsaturated carboxylic acid derivative, a (meth)acrylic acid amide derivative, and a maleimide derivative.

5) The solvent composition according to any one of 1) to 4) above, in which 30% by weight or more of the core-shell polymer particles is formed of styrene.

6) The solvent composition according to any one of 1) to 5) above, in which the core-shell polymer particles are copolymerized with 0.2 to 7% by weight of a crosslinkable monomer in 100% by weight of the core-shell polymer particles.

7) A varnish containing a resin and the solvent composition according to any one of 1) to 6) above.

8) A method for producing a varnish, the method including the step of mixing a resin and the solvent composition according to any one of 1) to 6) above.
9) A method for producing a prepreg, the method including the steps of
   mixing a resin with the solvent composition according to any one of 1) to 6) above;
   impregnating a fiber with a composition containing the resin and the core-shell polymer particles; and
   semi-curing the resin.
10) A method for producing a copper-clad laminated plate, the method including the steps of:
   mixing a resin with the solvent composition according to any one of 1) to 6) above;
   impregnating a fiber with a composition containing the resin and the core-shell polymer particles;
   semi-curing the resin to obtain a prepreg, and
   laminating the prepreg and a copper foil and curing the prepreg.
11) A method for producing a printed wiring board, the method including the steps of
   mixing a resin with the solvent composition according to any one of 1) to 6) above;
   impregnating a fiber with a composition containing the resin and the core-shell polymer particles;
   semi-curing the resin to obtain a prepreg;
   laminating the prepreg and a copper foil and curing the prepreg to obtain a copper-clad laminated plate, and
   forming a circuit on the copper-clad laminated plate.
12) A method for producing a paint, the method including the step of mixing a resin and the solvent composition according to any one of 1) to 6) above.
13) A method for producing an adhesive, the method including the step of mixing a resin and the sol vent composition according to any one of 1) to 6) above.
14) A method for producing a composite material, the method including the steps of:
   mixing a resin with the solvent composition according to any one of 1) to 6) above;
   combining a composition containing the resin and the core-shell polymer particles with an inorganic material; and
   curing the resin.
15) A method for producing a cast item, the method including the steps of
   mixing a resin and the solvent composition according to any one of 1) to 6) above; and
   curing the resin.
16) A method for producing a resin composition, the method including the step of evaporating the organic solvent (A) and/or the organic solvent (B) from the varnish according to 7) above.
17) A resin composition containing 100 parts by weight of a resin and 5 to 70 parts by weight of core-shell polymer particles, in which
   a total volatile content in the resin composition is 5000 ppm or less, and
   the solvent composition contains 10 ppm or more of an organic solvent (A) having a polar term $\delta p$ of a Hansen solubility parameter of less than 11 and a hydrogen bond term $\delta h$ of less than 10 and 10 ppm or more of an organic solvent (B) satisfying at least one of 11 or more of the polar term $\delta p$ and 10 or more of the hydrogen bond term $\delta h$.
18) The resin composition according to 17) above, in which the resin is a thermosetting resin.
19) The resin composition according to 17) above, in which the resin is an epoxy resin.

20) The resin composition according to any one of 17) to 19) above, in Which
   the organic sol vent (A) is one or more sol vents selected from the group consisting of toluene, xylem, ethyl acetate, propylene glycol monomethyl ether acetate, acetone, methyl ethyl ketone, methyl isobutyl ketone, and cyclohexanone, and
   the organic solvent (B) is one or more solvents selected from the group consisting of butanol, methyl cellosolve, butyl cellosolve, propylene glycol monomethyl ether, dimethylformamide, dimethylacetamide, dimethyl sulfoxide, and N-methyl-2-pyrrolidone.
21) The resin composition according to any one of 17) to 20) above, in which a volume average particle size of the core-shell polymer particles in the resin composition is 10 nm to 500 nm.
22) A cured product of the resin composition according to any one of 17) to 21) above.
23) A method for producing a solvent composition, the method including the steps of
   mixing an aqueous medium dispersion containing core-shell polymer particles dispersed in an aqueous medium with one or more organic solvents (A) having a polar term $\delta p$ of a Hansen solubility parameter of less than 11 and a hydrogen bond term $\delta h$ of less than 10,
   mixing a mixture of the aqueous medium dispersion and the organic solvent (A) with water to obtain a particle loose aggregate,
   separating and collecting the particle loose aggregate from a liquid phase,
   mixing one or more organic solvents (A) having a polar term $\delta p$ of a Hansen solubility parameter of less than 11 and a hydrogen bond term $\delta h$ of less than 10 with the particle loose aggregate to obtain a particle dispersion,
   mixing the particle dispersion with one or more organic solvents (B) satisfying at least one of 11 or more of the polar term $\delta p$ and 10 or more of the hydrogen bond term $\delta h$, and
   evaporating one or more substances selected from the group consisting of the organic solvent (A), the organic sol vent (B), and water in the obtained mixture, in which
   the organic solvent (A) and the organic solvent (B) are contained in a weight ratio of 15:85 to 95:5, and a content of the core-shell polymer particles is 20 to 40% by weight based on a total weight of the solvent composition.
24) A method for producing a varnish, the method including the step of producing a solvent composition by the method according to 23) above and then mixing a resin and the solvent composition.
25) A method for producing a resin composition, the method including the step of producing a varnish by the method according to 24) above and then evaporating the organic solvent (A) and/or the organic solvent (B) from the varnish.
26) A method for producing a prepreg, the method including the steps of:
   producing a resin composition by the method according to 25) above;
   impregnating a fiber with the resin composition or a dilution of the resin composition; and
   semi-curing the resin.
27) A method for producing a copper-clad laminated plate, the method including the steps of:
   producing a prepreg by the method according to 26) above; and
   laminating the prepreg and a copper foil and curing the prepreg.

28) A method for producing a printed wiring board, the method including the steps of:
producing a copper-clad laminated plate by the method according to 27) above; and
forming a circuit on the copper-clad laminated plate.

29) A method for producing a paint, the method including the step of producing a resin composition by the method according to 25) above.

30) A method for producing an adhesive, the method including the step of producing a resin composition by the method according to 25) above.

31) A method for producing a composite material, the method including the steps of producing a resin composition by the method according to 25) above;
combining the resin composition or a dilution of the resin composition with an inorganic material; and
curing the resin.

32) A method for producing a cast item, the method including the steps of:
producing a resin composition by the method according to 25) above; and
curing the resin.

33) A solventless paint containing the resin composition according to 17) above.

34) A solventless adhesive containing the resin composition according to 17) above.

35) A prepreg containing the resin composition according to 17) above.

36) A prepreg containing a cured product of the resin composition according to 17) above.

37) A composite material containing the resin composition according to 17) above.

38) A composite material containing a cured product of the resin composition according to 17) above.

39) A copper-clad laminated plate containing a cured product of the resin composition according to 17) above.

40) A printed wiring board containing a cured product of the resin composition according to 17) above.

41) The sol vent composition according to any one of 1) to 6) above, which is a raw material for varnish.

42) The solvent composition according to any one of 1) to 6) above, which is a raw material for prepreg.

43) The solvent composition according to any one of 1) to 6) above, which is a raw material for a copper-clad laminated plate.

44) The solvent composition according to any one of 1) to 6) above, which is a raw material for a printed wiring board.

45) The solvent composition according to any one of 1) to 6) above, which is a raw material for paint.

46) The solvent composition according to any one of 1) to 6) above, which is a raw material for composite material.

47) The solvent composition according to any one of 1) to 6) above, which is a raw material for cast item.

48) The solvent composition according to any one of 1) to 6) above, which is a raw material for adhesive.

49) A copper-Clad laminated plate containing a cured product of an epoxy resin composition, in which
the cured product contains 1 ppm or more of one or more organic solvents (A) having a polar term $\delta p$ of a Hansen solubility parameter of less than 11 and a hydrogen bond term $\delta h$ of less than 10 and 1 ppm or more of one or more organic solvents (B) satisfying at least one of 11 or more of the polar term $\delta p$ and 10 or more of the hydrogen bond term $\delta h$, and the cured product has a total volatile content of 100 ppm or less.

50) A printed wiring board containing a cured product of an epoxy resin composition, in which
the cured product contains 1 ppm or more of one or more organic solvents (A) having a polar term $\delta p$ of a Hansen solubility parameter of less than 11 and a hydrogen bond term $\delta h$ of less than 10 and 1 ppm or more of one or more organic sol vents (B) satisfying at least one of 11 or more of the polar term $\delta p$ and 10 or more of the hydrogen bond term $\delta h$, and the cured product has a total volatile content of 100 ppm or less.

The solvent composition according to one or more embodiments of the present invention contains core-shell polymer particles stably dispersed at a high concentration in an organic solvent, has a low viscosity and is easy to be handled. Therefore, it is possible to easily disperse the core-shell polymer particles associated with the matrix resin and characteristics in each application without bringing an excessive amount of a solvent into a varnish used in the production of printed wiring boards and paints, and higher toughness of printed wiring boards and paints can be achieved.

DETAILED DESCRIPTION OF EMBODIMENTS

One or more embodiments of the present invention will be described below.

(Solvent Composition)

The solvent composition according to one or more embodiments of the present invention contains an organic solvent containing, in a weight ratio of 15:85 to 95:5, one or more organic solvents (A) having a polar term $\delta p$ of a Hansen solubility parameter of less than 11 and a hydrogen bond term $\delta h$ of less than 10 and one or more organic solvents (B) satisfying at least one of 11 or more of the polar term $\delta p$ and 10 or more of the hydrogen bond term $\delta h$ and one or more types of core-shell polymer particles. In this solvent composition, a content of the core-shell polymer particles is 20 to 40% by weight based on the total weight of the solvent composition.

The Hansen Solubility Parameter (HSP) means a vector quantity parameter obtained by dividing the Hildebrand solubility parameter into three cohesive energy components: London dispersion force, dipole-dipole forces, and hydrogen bonding force. In one or more embodiments of the present invention, a component corresponding to the London dispersion force of HSP is referred to as a dispersion term (hereinafter also referred to as "$\delta d$"), a component corresponding to the dipole-dipole forces is referred to as a polar term (hereinafter also referred to as "$\delta p$"), and a component corresponding to the hydrogen bonding force is referred to as a hydrogen bonding term (hereinafter also referred to as "$\delta h$"). Since HSP is a vector quantity, it is known that there are almost no pure substances having exactly the same value. A database has been constructed for HSPs of commonly used substances. For this reason, those skilled in the art can obtain the HSP value of a desired substance by referring to the database. Even for substances whose HSP values are not registered in the database, those skilled in the art can calculate the HSP values from their chemical structures by using computer software such as Hansen Solubility Parameters in Practice (HSPiP). In the case of a mixture composed of a plurality of substances, the HSP value of the mixture is calculated as the sum of values obtained by multiplying the HSP value of each substance as a contained component by the volume ratio of the substance to the whole mixture. Regarding HSP, for example, Hiroshi Yamamoto, S. Abbott, C. M. Hansen, Chemical industry. Mardi 2010 can be referred to.

The organic solvent (A) and the organic solvent (B) are selected so as to be mixed without phase separation in at least a specific weight ratio within the above weight ratio range. It is easy to mix the organic solvent (A) and the organic solvent (B) without phase separation within the above weight ratio range, so that δp of the organic solvent (A) is preferably 1 or more, more preferably 3 or more, and further preferably 5 or more. δh of the organic solvent (A) is preferably 3 or more, more preferably 4 or more, and further preferably 5 or more. For the same reason, δp of the organic solvent (B) is preferably 16 or less, more preferably 15 or less, and further preferably 14 or less. δh of the organic solvent (B) is preferably 40 or less, more preferably 20 or less, and further preferably 15 or less.

The organic solvent (A) corresponds to a low/medium polarity solvent, and the organic solvent (B) corresponds to a high polarity solvent. In many types of core-shell polymer particles that can toughen printed wiring boards and paints, the core layer is made of nonpolar rubber or other cross-linked bodies, and the shell layer is formed from a polymer having a higher polarity than the core layer. At this time, when only the organic solvent (A) is used in the solvent composition containing the core-shell polymer particles, the solvent penetrates into the core layer, and the core layer swells, which causes thickening due to an increase in volume of the particles. Thus, it is considered that by using the organic solvent (B) in addition to the organic solvent (A), swelling of the core layer due to the organic solvent is suppressed, and at the same time, affinity between the organic solvent and the shell layer is improved, Whereby while the core-shell polymer particles are stably dispersed at a high concentration in the organic solvent, a low viscosity solvent composition can be achieved.

In order to achieve the above, the organic solvent (A) is preferably one or more solvents selected from the group consisting of aromatic hydrocarbons such as toluene and xylene; esters such as ethyl acetate and propylene glycol monomethyl ether acetate; and ketones such as acetone, methyl ethyl ketone, methyl isobutyl ketone, and cyclohexanone. The organic solvent (B) is preferably one or more solvents selected from the group consisting of butanol, methyl cellosolve, butyl cellosolve, propylene glycol monomethyl ether, dimethylformamide, dimethylacetamide, dimethyl sulfoxide, and N-methyl-2-pyrrolidone.

In particular, from the viewpoint of low toxicity and easy handling at a boiling point of 150° C. or lower, the organic solvent (A) is preferably toluene, xylene, propylene glycol monomethyl ether acetate, methyl ethyl ketone, and/or methyl isobutyl ketone, and the organic solvent (B) is preferably methyl cellosolve and/or propylene glycol monomethyl ether. More preferably, the organic solvent (A) is toluene, xylene, and/or methyl ethyl ketone, and the organic solvent (B) is methyl cellosolve and/or propylene glycol monomethyl ether.

From the viewpoint that while the core: shell polymer particles are stably dispersed at a high concentration of 20% by weight or more, a solvent composition which has a low viscosity and is easily handled can be obtained, the weight ratio of the organic solvent (A) and the organic solvent (B) in the organic solvent is 15:85 to 95:5, more preferably 20:80 to 90:10, further preferably 30:70 to 80:20, and most preferably 35:65 to 70:30. When the weight ratio of the organic solvent (A) or the organic solvent (B) is higher than 15:85 to 95:5, thickening of the solvent composition or aggregation of the core-shell polymer particles occurs.

The water content in the solvent composition according to one or more embodiments of the present invention is preferably 1% by weight or less in 100% by weight of the solvent composition. If the water content exceeds 1% by weight, it may cause surface roughness, fish eyes, and foaming of a prepreg in a method for producing a printed wiring board and a coating film obtained from a paint.

The content of the core-shell polymer particles in the solvent composition according to one or more embodiments of the present invention is 20 to 40% by weight, preferably 22 to 38% by weight, and more preferably 24 to 36% by weight, based on the total weight of the solvent composition. When the content of the core-shell polymer particles is less than 20% by weight, a solvent is excessively brought into a varnish used in the production of a printed wiring board or a paint, which causes poor workability. When the content is higher than 40% by weight, the sol vent composition is thickened, and handleability is deteriorated.

The total content of the organic solvent in the solvent composition according to one or more embodiments of the present invention is preferably 60 to 80% by weight, more preferably 62 to 78% by weight, and further preferably 64 to 76% by weight based on the total weight of the solvent composition for the same reason as described above.

The solvent composition according to one or more embodiments of the present invention may contain a small amount of a curable resin (hereinafter also referred to as other curable resins). Specifically, other curable resins can be contained in an amount of usually 0 to 300 parts by mass, preferably 0 to 200 parts by mass, more preferably 0 to 100 parts by mass, further preferably 0 to 50 parts by mass, particularly preferably 0 to 10 parts by mass, relative to 100 parts by mass of the core: shell polymer particles. However, it is most preferable that the solvent composition according to one or more embodiments of the present invention do not contain other curable resins. For solvent compositions not containing other curable resins, varnishes for various applications can be produced by blending a matrix resin suitable for various applications. Thus, the solvent composition not containing other curable resins has an advantage that it can be used tar production of varnishes for a wide range of uses.

(Core-Shell Polymer Particles)

In the solvent composition according to one or more embodiments of the present invention, the core-shell polymer particles are preferably present in the solvent composition at a volume average particle size of 10 nm to 500 nm. The volume average particle size is more preferably 30 nm to 350 nm, further preferably 60 nm to 250 nm, most preferably 80 nm to 150 nm. If the volume average particle size is within the above range, aggregates of the core-shell polymer particles may be present in the solvent composition. However, the core-shell polymer particles are preferably dispersed in the solvent composition in the form of primary particles. When the volume average particle size is less than 10 nm or more than 500 am, the toughening effect of the core-shell polymer particles may be lowered. From the viewpoint of suppressing the influence on the color tone of the printed wiring board and paint, the volume average particle size of the core-shell polymer particles is more preferably 250 nm or less, and further preferably 150 nm or less. The volume average particle size can be measured using Microtrac LTA (manufactured by Nikkiso Co., Ltd.), for example.

The dispersion of the core-shell polymer particles in the form of primary particles can be confirmed by, for example, the value of volume average particle size (Mv)/number average particle size (Mn) being 3 or less. This value is preferably 2.5 or less, more preferably 2 or less, and further preferably 1.5 or less. When the value of the volume average particle size (Mv)/number average particle size (Mn) exceeds 3, it indicates that the core-shell polymer particles form a secondary aggregate. The volume average particle size (Mv)/the number average particle size (Mn) can be obtained by measuring the volume average particle size (Mv) and the number average particle size (Mn) of the particles in the composition with the use of Microtrac UPA (Nikkiso Co., Ltd.) and dividing the volume average particle size (Mv) by the number average particle size (Mn).

From the viewpoint that a dispersion diameter in the solvent composition can be easily secured, a primary particle size of the core-shell polymer particles is preferably 10 nm to 500 nm, more preferably 30 nm to 400 nm, further preferably 60 nm to 300 nm, and most preferably 80 nm to 200 nm. As the average primly particle size, the value of the volume average particle size can be used as it is as long as the value of the volume average particle size (Mv)/the number average particle size (Mn) is 3 or less.

The core-shell polymer particles used one or more embodiments of the present invention are core-shell polymer particles in which a shell part is formed by graft-polymerizing a graft-copolymerizable monomer (a monomer for shell-formation) to a crosslinked polymer serving as a core layer. The core-shell polymer particles have a structure having a core layer formed of a crosslinked polymer existing inside and at least one shell layer graft-copolymerized onto a surface of the core layer and covering the periphery or part of the crosslinked polymer. From the viewpoints that the viscosity of the solvent composition according to one or more embodiments of the present invention is kept low and the solvent composition can be easy to handle, that the core-shell polymer particles are stably dispersed in the solvent composition, and that the toughening effect that is the purpose of the solvent composition is increased, a weight ratio of the core layer and the shell layer is preferably in the range of 50/50 to 99/1, more preferably 60/40 to 95/5, and further preferably 70/30 to 90/10, in terms of a value of the core layer/the shell layer (weight ratio of monomers forming a polymer of each layer).

The core layer is preferably composed of a crosslinked polymer and preferably does not substantially dissolve in the solvent. A gel content in the core layer is preferably 60% by weight or more, more preferably 80% by weight or more, further preferably 90% by weight or more, and particularly preferably 95% by weight or more.

The core layer preferably includes (i) a rubber elastic body formed from 50% by weight or more and 100% by weight or less of one or more monomers selected from the group consisting of dime monomers and (meth)acrylic ester monomers, and less than 50% by w of another copolymerizable vinyl monomer; (ii) a poly siloxane rubber-based elastic body; (iii) an aromatic vinyl crosslinked body; or (iv) a mixture of two or more of (i) to (iii). The other copolymerizable vinyl monomer is preferably one or more selected from the group consisting of aromatic vinyl compounds, vinyl cyanide compounds, unsaturated carboxylic acid derivatives, (meth)acrylic acid amide derivatives, and maleimide derivatives. It is to be noted that in one or more embodiments of the present invention, the term (meth)acryl refers to acryl and/or methacryl.

Examples of the diene monomers include butadiene, isoprene, and chloroprene, and butadiene is particularly preferred. Examples of the (meth)acrylic ester monomers include butyl acrylate, 2-ethylhexyl acrylate, and lauryl methacrylate, and butyl acrylate and 2-ethylhexyl acrylate are particularly preferred. These may be used either alone, or two or more of these may be used in combination.

The amount of one or more monomers selected from the group consisting of diene monomers and (meth)acrylic ester monomers is preferably 50% by weight or more, and more preferably 60% by weight or more, relative to the weight of the whole core layer. If the amount of the monomer is less than 50% by weight, the toughening effect of the core-shell polymer particles may be lowered.

The core layer may be a homopolymer or a copolymer obtained by polymerizing one or more monomers selected from the group consisting of a diene monomer and a (meth)acrylic ester monomer. However, the core layer may be a copolymer of a diene monomer and/or a (meth)acrylic ester monomer and a vinyl monomer copolymerizable therewith. Such a copolymerizable vinyl monomer includes one or more monomers selected from the group consisting of aromatic vinyl compounds, vinyl cyanide compounds, unsaturated carboxylic acid derivatives, (meth)acrylic acid amide derivatives, and maleimide derivatives. Examples of the aromatic vinyl compounds include styrene, α-methylstyrene, and vinylnaphthalene. Examples of the vinyl cyanide compounds include (meth)acrylonitrile and substituted acrylonitriles. Examples of the unsaturated carboxylic acid derivatives include (meth)acrylic acid, itaconic acid, crotonic acid, and maleic anhydride. The (meth)acrylate amide derivative includes (meth)acrylamide (containing N-substituted body) and the like. Examples of maleimide derivatives include maleic imide (containing N-substituted body). These may be used either alone, or two or more of these may be used in combination. The amount of the copolymerizable vinyl monomer is preferably less than 50% by weight, and more preferably less than 40% by weight based on the weight of the whole core layer. In particular, the core layer is preferably a styrene-butadiene rubber from the viewpoint of reducing the dielectric loss tangent of the core-shell polymer particles and contributing to improving electrical characteristics of the copper-clad laminated plate.

The core layer may be an aromatic vinyl crosslinked body. Examples of the crosslinked body include a copolymer of an aromatic vinyl compound and a crosslinkable monomer. Examples of the aromatic vinyl compound include unsubstituted vinyl aromatic compounds such as styrene and 2-vinylnaphthalene, substituted vinyl aromatic compounds such as α-methyl styrene; ring-alkylated vinyl aromatic compounds such as 3-methylstyrene, 4-methylstyrene, 2,4-dimethylstyrene, 2,5-dimethylstyrene, 3,5-dimethylstyrene, and 2,4,6-trimethylstyrene, ring-alkoxylated vinyl aromatic compounds such as 4-methoxystyrene and 4-ethyoxystyrene; ring-halogenated vinyl aromatic compounds such as 2-chlorostyrene and 3-chrolostyrene; ring-ester-substituted vinyl aromatic compounds such as 4-acetoxystyrene; and ring-hydroxylated vinyl aromatic compounds such as 4-hydroxystyrene. When the core layer is an aromatic vinyl crosslinked body, a copper-clad laminated plate and paint to which the core-shell polymer particles are added are preferred because toughness is increased without lowering rigidity.

When the core layer contains (i) the rubber elastic body or (iii) the aromatic vinyl crosslinked body, in order to adjust a degree of crosslink, or in order to cover the core layer and suppress swelling of the core layer due to the solvent, a crosslinkable monomer may be used as a component constituting the core layer. Examples of the crosslinkable monomer include divinylbenzene, butanediol di(meth)acrylate, triallyl (iso)cyanurate, allyl (meth)acrylate, diallyl itaconate, and diallyl phthalate. The amount of the crosslinkable monomer used is preferably 0.2 to 7% by weight, more preferably 0.5 to 5% by weight, and further preferably 1 to 3% by weight in 100% by weight of the core-shell polymer particles. If the amount used exceeds 7% by weight, the toughening effect of the core-shell polymer particles may be lowered. In particular, the covering of the core layer with the crosslinkable monomer is preferred because it is also effective in suppressing fusion between the core-shell polymer particles, and therefore, when the solvent composition according to one or more embodiments of the present invention is produced, sticking of the core-shell polymer particles to a vessel wall of a mixing vessel or the like is suppressed.

A chain transfer agent may be used in the polymerization of the core layer so as to control the molecular weight or the degree of crosslink of the polymer for constituting the core layer Examples of usable chain transfer agents include alkylmercaptane of 5 to 20 carbon atoms. The amount of the chain transfer agent used is preferably 5% by weight or less, and more preferably 3% by weight or less, in 100% by weight of the core layer. When the amount of the chain transfer agent used exceeds 5% by weight, the amount of uncrosslinked components contained in the core layer increases, the viscosity of the solvent composition according to one or more embodiments of the present invention increases, and handling becomes difficult.

The core layer may include a polysiloxane rubber-based elastic body. As the polysiloxane rubber-based elastic body, for example, it is possible to use a polysiloxane rubber containing alkyl- or aryl-disubstituted silyloxy units such as dimethyl silyloxy, methylphenyl silyloxy, and diphenyl silyloxy. In addition, in the polysiloxane rubber-based elastic body, if necessary, it is more preferable that the crosslinked structure is previously introduced by partially using a multifunctional alkoxysilane compound or radically reacting a silane compound having a vinyl reactive group at the time of polymerization.

Since various core-shell polymer particles can be dispersed in the solvent composition according to one or more embodiments of the present invention, the type of polymer constituting the shell layer is not particularly limited. However, because of its high affinity with matrix resins used for copper-clad laminated plates and paints, the polymer constituting the shell layer is preferably a (co) polymer obtained by polymerizing one or more selected from (meth)acrylic ester monomers, aromatic vinyl monomers, vinyl cyanide monomers, unsaturated carboxylic acid derivatives, (meth)acrylamide derivatives, and maleimide derivatives.

In particular, in order to endow the shell layer with chemical reactivity with an epoxy resin or the like, the polymer constituting the shell layer is more preferably a copolymer obtained by copolymerizing the (meth)acrylic ester monomer, aromatic vinyl monomer, vinyl cyanide monomer, unsaturated carboxylic acid derivative, (meth)acrylamide derivative, or maleimide derivative described above and one or more vinyl monomer having a functional group selected from the group consisting of epoxy groups, carboxyl groups, hydroxyl groups, amino groups, and carbon-carbon double bonds. These functional groups may have reactivity with an epoxy resin, a curing agent, a curing catalyst, and the like. This makes the core-shell polymer particles have the function of causing chemical reaction with the epoxy resin or the like or curing agent to form bondings under the conditions that the epoxy resin or the like is reacted with the curing agent to cause curing, whereby the re-aggregation of the core-shell polymer particles and deterioration of the dispersion state can be effectively prevented under the curing conditions.

Examples of the (meth)acrylic ester monomers include alkyl (meth)acrylate such as methyl (meth)acrylate, ethyl (meth)acrylate, butyl (meth)acrylate, and 2-ethylhexyl (meth)acrylate. Examples of aromatic vinyl monomers include alkyl-substituted styrenes such as styrene and α-methylstyrene, and halogen-substituted styrenes such as bromostyrene and chlorostyrene. Examples of the vinyl cyanide monomer include (meth)acrylonitrile and substituted (meth)acrylonitrile. Examples of the unsaturated carboxylic acid derivatives include (meth)acrylic acid, itaconic acid, crotonic acid, and maleic anhydride. The (meth)acrylate amide derivative includes (meth)acrylamide (containing N-substituted body) and the like. Examples of maleimide derivatives include maleic imide (containing N-substituted body). Examples of a monomer having a reactive functional group include (meth)acrylic acid esters having a reactive side chain, such as 2-hydroxyethyl (meth)acrylate, 2-aminoethyl (meth)acrylate, and glycidyl (meth)acrylate; and vinyl ethers having a reactive functional group such as glycidyl vinyl ether and allyl vinyl ether.

In one or more embodiments of the present invention, the shell layer of the core-shell polymer particles is preferably formed from, for example, a polymer of monomers for shell layer formation (100% by mass in total) formed by combining 0 to 80% by mass (preferably 10 to 70% by mass) of aromatic vinyl monomer (especially styrene), 0 to 50% by mass (preferably 1 to 30% by mass, more preferably 10 to 25% by mass) of vinyl cyanide monomer (especially acrylonitrile), 0 to 50% by mass (preferably 5 to 45% by mass) of (meth)acrylic ester monomer (especially methyl methacrylate), and 0 to 50% by mass (preferably 5 to 30% by mass, more preferably 10 to 25% by mass) of a monomer having a reactive functional group (especially glycidyl methacrylate).

In particular, from the viewpoint of reducing the dielectric loss tangent of the core-shell polymer particles and contributing to improvement of the electrical properties of the copper-clad laminated plate, 30% by weight or more of the core-shell polymer particles is preferably composed of styrene, more preferably 40% by weight or more, and further preferably 50% by weight or more. The core-shell polymer particles having such a high styrene content tend to be swollen with an organic solvent, and a solvent composition has been thickened. However, the use of the solvent composition according to one or more embodiments of the present invention suppresses the swelling and can obtain a low viscosity solvent composition. Thus, it is significant to use core-shell polymer particles having a high styrene content as the core-shell polymer particles in one or more embodiments of the present invention.

A method for producing the core-shell polymer particles is not particularly limited, and the core-shell polymer particles can be produced by a well-known method such as emulsion polymerization, suspension polymerization, microsuspension polymerization or the like. Among these production methods, the production method using multistage emulsion polymerization is particularly suitable. Specific examples of emulsifiers (dispersants) usable in the emulsion polymerization include alkali metal salts or ammonium salts of various acids such as alkyl or arylsulfuric acids such as dioctylsulfosuccinic acid and dodecylbenzenesulfonic acid, alkyl or arylether sulfonic acids, alkyl or arylsulfuric acids such as dodecylsulfuric acids, alkyl or arylether sulfuric acids, alkyl or aryl-substituted phosphoric acids, alkyl or arylether-substituted phosphoric acids, N-alkyl or arylsarcosinic acids such as dodecylsarcosinic acid, alkyl or arylcarboxylic acids such as oleic acid and stearic acid, and alkyl or arylether carboxylic acids; anionic emulsifiers or dispersants such as alkyl or aryl-substituted polyethylene glycols; and dispersants such as polyvinyl alcohol, alkyl-substituted celluloses, polyvinyl pyrrolidone, and polyacrylic acid derivatives. These may be used alone or in combinations of two or more.

Front the viewpoint of polymerization stability, the emulsifier is preferably an anionic emulsifier, more preferably an anionic emulsifier of an alkali metal salt, and further preferably an anionic emulsifier of a sodium salt and/or a potassium salt.

For the purpose of some embodiments of the present invention, the amount of each of these emulsifiers (dispersants) to be used during the process of producing the aqueous medium dispersion containing the core-shell polymer particles may more preferably be as little as possible, as long as dispersion stability is not impaired. Alternatively, each of these emulsifiers (dispersants) may be extracted and removed during the process of producing the solvent composition to the extent that the remaining emulsifier (dispersant) has no negative influence on physical properties in the application in which the solvent composition is used. For this reason, the emulsifying (dispersing) agent is more preferably water-soluble.

(Method for Producing Solvent Composition)

Although the method for producing the solvent composition of the present invention is not particularly limited, an embodiment of the production method will be specifically described below According to the present embodiment, the method for producing a solvent composition may include, in order, a first step of obtaining a core-shell polymer particle loose aggregate from an aqueous medium dispersion containing core-shell polymer particles (preferably an aqueous latex obtained by emulsion polymerization), a second step of obtaining a particle dispersion containing the core-shell polymer particles and the organic solvent (A) from the core-shell polymer particle loose aggregate, and a third step of mixing the particle dispersion with the organic solvent (B) and then evaporating the organic solvent and/or water.

More specifically, the production method of the present embodiment may include a first step of mixing an aqueous medium dispersion, containing the core-shell polymer particles dispersed in an aqueous medium, with the organic solvent (A) and then mixing the mixture with water to obtain a core-shell polymer particle loose aggregate, a second step of separating the core-shell polymer particle loose aggregate from a liquid phase and then mixing with the organic solvent (A) to obtain a particle dispersion containing the core-shell polymer particles and the organic solvent (A), and a third step of mixing the particle dispersion with the organic solvent (B) and evaporating the organic solvent and/or water from the obtained mixture. Consequently, a solvent composition in which the core-shell polymer particles are stably dispersed at a high concentration can be easily obtained. The production method is preferred because of its excellent handling properties. Hereinafter, each step will be described in detail.

(First Step: Preparation of Core-Shell Polymer Particle Loose Aggregate)

The first step includes a procedure of mixing an aqueous medium dispersion containing the core-shell polymer particles dispersed in an aqueous medium with an organic solvent (A). The mixture with the organic solvent (A) causes phase separation due to addition of water, which will be described later, and it becomes possible to form a core-shell polymer particle loose aggregate in a moderately aggregate state in which aggregates can be redispersed.

For the purpose of easy separation from the liquid phase (mainly the aqueous phase) in the second step described below, the organic solvent (A) may preferably have a specific gravity lower than water.

The amount of the organic solvent (A) to be mixed with the aqueous medium dispersion is preferably 50 parts by mass or more, and more preferably 60 parts by mass or more, relative to 100 parts by mass of the aqueous medium dispersion. Also, the amount of the organic sol vent (A) is preferably 250 parts by mass or less, and more preferably 150 parts by mass or less. If the amount of the organic solvent (A) is less than 50 parts by mass, the core-shell polymer particle loose aggregate may be unlikely to be formed. Also, if the amount of the organic solvent (A) exceeds 250 parts by mass, a required amount of water to be added for obtaining the core-shell polymer particle loose aggregate increases, which may lead to a lowering of production efficiency.

As the procedure of mixing the aqueous medium dispersion with the organic solvent (A), a known device can be employed. For example, a conventional apparatus such as a mixing vessel equipped with an impeller may be used, or a static mixer or a line mixer (a type in which a mixing apparatus is installed on a part of a pipe) may be used.

The first step involves a procedure of further adding water and mixing the resultant mixture subsequent to the procedure of mixing the aqueous medium dispersion with the organic solvent (A). Thereby, phase separation occurs, and a core-shell polymer particle loose aggregate in a moderately aggregate state in which aggregates can be redispersed can be formed in a liquid phase. In addition, most electrolyte such as a water-soluble emulsifier or dispersant, a water-soluble polymerization initiator or a reducing agent, which may be used in the preparation of the aqueous medium dispersion and be contained in the aqueous medium dispersion, can be eluted into the aqueous phase.

In this procedure, the amount of water to be mixed is preferably 40 parts by mass or more, and more preferably 60 parts by mass or more, relative to 100 parts by mass of the organic solvent (A) which is used in the mixing with the aqueous medium dispersion. Also, the amount of water is preferably 300 parts by mass or less, and more preferably 250 parts by mass or less. If the amount of water mixed is less than 40 parts by mass, it is often difficult to obtain the core-shell polymer particles in the form of loose aggregates. If the amount of water mixed exceeds 300 parts by mass, the concentration of the organic solvent in the core-shell polymer particle loose aggregate is decreased in the second step described later. As a result, the prolongation of the time required for mixing the core-shell polymer particle loose aggregate and the organic solvent (A) and re-dispersing the core-shell polymer particles in the organic solvent (A) and the like may occur, and thus the dispersibility of the core-shell polymer particles may be deteriorated.

(Second Step: Preparation of Particle Dispersion Containing Core-Shell Polymer Particles)

The second step involves a procedure of separating and collecting the core-shell polymer particle loose aggregate obtained in the first step from the liquid phase. This procedure enables the separation and removal of water-soluble contaminants including an emulsifier from the core-shell polymer particles.

The core-shell polymer particle loose aggregate generally has a property of floating in a liquid phase. Therefore, when a mixing vessel is used in the first step, examples of the method for separating and collecting the core-shell polymer particle loose aggregate from the liquid phase include a method including discharging the liquid phase (an aqueous phase in most cases) through the bottom of the mixing vessel and a method including filtrating the core-shell polymer particle loose aggregate using a paper filter, a filter cloth and a metallic screen having a relatively coarse mesh size.

The content of the organic solvent (A) in the obtained core-shell polymer particle loose aggregate is preferably 30% by mass or more, and more preferably 35% by mass or more, relative to 100% by mass of the core-shell polymer particles. Also, the content of the organic solvent (A) is preferably 75% by mass or less, and more preferably 70% by mass or less. If the content of the organic solvent (A) contained in the loose aggregate is less than 30% by mass, disadvantages may occur, such as a disadvantage that the time required for the re-dispersion of the core-shell polymer particles in the organic solvent (A), which will be described later, is prolonged and a disadvantage that the aggregate aggregated to the extent that the core-shell polymer particles cannot be re-dispersed tend to remain. If the content of the organic solvent (A) exceeds 75% by mass, a large quantity of water is dissolved in the organic solvent and remains in the loose aggregate, which may cause the aggregation of the core-shell polymer particles in the third step.

In the present specification, the amount of the organic solvent contained in the core-shell polymer particle loose aggregate can be determined by accurately weighing the core-shell polymer particle loose aggregate, then drying the core-shell polymer particle loose aggregate at 120° C. for 15 minutes, and measuring the mass of loss as the amount of the organic solvent contained in the loose aggregates.

The second step further includes a procedure of mixing the core-shell polymer particle loose aggregate obtained as above with the organic solvent (A) to obtain a core-shell polymer particle dispersion. Since the core-shell polymer particles are aggregated in a loose state in the core-shell polymer particle loose aggregate, the core-shell polymer particles can be easily redispersed as primary particles in the organic solvent (A) by mixing the loose aggregate with the organic solvent (A).

The organic solvent used in the second step is the organic solvent (A), similar to the organic solvent used in the first step. By using the organic solvent (A), the organic solvent can be azeotroped with water when the organic solvent is evaporated and removed in the third step described later, and the water contained in the solvent composition can be removed. Although the organic solvent (A) used in the second step may be of a different type from the organic solvent (A) used in the first step, from the viewpoint of more reliably redispersing the core-shell polymer particles in the second step, the organic solvent (A) used in the second step is preferably the same as the organic solvent (A) used in the first step.

The amount of the organic solvent (A) to be used in the second step is preferably 40 parts by mass or more, more preferably 200 parts by mass or more, relative to 100 parts by mass of the core-shell polymer particle loose aggregate. Also, the amount of the organic solvent (A) is preferably 1400 parts by mass or less, more preferably 1000 parts by mass or less. When the amount of the organic solvent (A) is less than 40 parts by mass, it becomes difficult to uniformly disperse the core-shell polymer particles in the organic solvent, and the agglomerated core-shell polymer particles may remain as lumps, or the viscosity increases, which may make handling difficult. Also, if the amount of the organic solvent (A) exceeds 1400 parts by mass, a large amount of energy and large equipment will be uneconomically required to evaporate and remove the solvents in the third step described below.

In one or more embodiments of the present invention, between the first step and the second step, the procedure may be performed one or more times in which the core-shell polymer particle loose aggregate obtained in the first step is separated and collected from the liquid phase, mixed with the organic solvent (A), and then further mixed with water to obtain the core-shell polymer particle loose aggregate again. This further reduces the residual amount of water-soluble impurities such as an emulsifier contained in the core-shell polymer particle loose aggregate.

(Third Step: Preparation of Solvent Composition Containing Core-Shell Polymer Particles)

The third step includes a procedure of mixing the organic solvent (B) with the core-shell polymer particle dispersion obtained in the second step and a procedure of evaporating the organic solvent and/or water. The evaporation can remove water contained in the core-shell polymer particle dispersion, adjust the particle concentration in the final solvent composition, and substitute a part of the organic solvent (A), used in the first step and the second step, with the organic solvent (B) to be contained in the final solvent composition. Through the third step, the low viscosity solvent composition according to one or more embodiments of the present invention can be obtained while the core-shell polymer particles are stably dispersed at a high concentration.

The amount of the organic solvent (B) used in the third step is not particularly limited, but may be, for example, about 50 to 1000 parts by mass relative to 100 parts by mass of the core-shell polymer particles.

A method of evaporating water and/or the organic solvent from the mixture obtained by mixing the organic solvent (B) is not particularly limited, and a known method can be applied. Examples of such methods include a method of charging a mixture of the core-shell polymer particle dispersion and the organic solvent (B) in a vessel, and heating and evaporating the mixture under reduced pressure; a method of bringing the mixture into contact with a dry gas in a counterflow manner in a vessel; a continuous method using a thin film type evaporator; and a method using an extruder or continuous mixing vessel equipped with an evaporation mechanism. The conditions for removing the solvent, such as the temperature and required period of time, can be appropriately selected within ranges that do not impair the quality of the resulting solvent composition.

The solvent composition according to one or more embodiments of the present invention can be mixed with a resin and used to produce a varnish. That is, the solvent composition according to one or more embodiments of the present invention can be used as a raw material for varnish.

(Varnish)

A varnish according to one or more embodiments of the present invention is a mixture of the solvent composition according to one or more embodiments of the present invention and a resin. Examples of the resin which is a component of the varnish according to one or more embodiments of the present invention include curable or polymerizable monomers, curable or polymerizable oligomers, resins obtained by curing these monomers or oligomers, and thermoplastic polymers. These may be used either alone, or two or more of these may be used in combination. In particular, it is preferable that when the resin is one or more selected from the group consisting of curable or polymerizable monomer, and curable or polymerizable oligomer, and is liquid at ordinary temperature, cured products of various shapes which have excellent toughness can be obtained by curing or polymerizing these resins.

As the curable or polymerizable monomer, or the curable or polymerizable oligomer, an organic compounds containing a functional group having polymerizable or curable reactivity is preferred. As the functional group having polymerizable or curable reactivity, preferred is at least one selected from the group consisting of an epoxy group, an oxetane group, a hydroxyl group, a carbon-carbon double bond, an amino group, an imide group, a carboxylic acid group, a carboxylic acid anhydride group, a cyclic ester group, a cyclic amide group, a benzoxazine group, and a cyanate ester group. Among these, compounds having an epoxy group, an oxetane group, a phenolic hydroxyl group, a cyclic ester, a cyanate ester, a benzoxazine group, and/or a carbon-carbon double bond are more preferable in terms of the range of their potential applications as polymerizable/curable resins, and compounds having an epoxy group, so-called epoxy resins, are particularly preferable.

Examples of epoxy resins include glycidyl ether-substituted compounds having a basic skeleton compound such as a bisphenol compound, a hydrogenerated bisphenol compound, a phenol or o-cresol novolac, an aromatic amine, a polycyclic aliphatic or aromatic compound; and compounds having a cyclohexene oxide skeleton. Typically, bisphenol A diglycidyl ether and condensates thereof, so-called bisphenol A epoxy resins, are preferable.

The varnish according to one or more embodiments of the present invention can further contain a curing agent, a hardener, a catalyst, a flame retardant, a synergist, an additive, an inert filler, and the like.

The varnish according to one or more embodiments of the present invention can suitably be used for molding materials, adhesives, fiber or tiller reinforced composite materials, sealing materials, casting materials, insulating materials, coating materials, filling materials, stereolithography materials, optical components, inks, and toners and raw materials thereof.

When the resin is a curable or polymerizable monomer examples of methods that can be used to mold the varnish according to one or more embodiments of the present invention include transfer molding, injection molding, cast molding, coating and baking, rotary molding, stereolithography, hand lay-up molding using carbon fibers, glass fibers, or the like, prepreg molding, pultrusion, filament winding molding, press molding, resin transfer molding (RIM or VaRTM), and SMC molding. The present invention is not limited to these methods.

(Resin Composition)

By evaporating the organic solvent (A) and/or the organic solvent (B) front the varnish according to one or more embodiments of the present invention, a resin composition having a low volatile content can be produced. As the resin composition having a low volatile content, for example, a resin composition having a total volatile content in the resin composition of 5000 ppm or less is preferred. The resin composition having a total volatile content of 5000 ppm or less in one or more embodiments of the present invention preferably includes 10 ppm or more of the organic solvent (A) having a polar term $\delta p$ of a Hansen solubility parameter of less than 11 and a hydrogen bond term $\delta h$ of less than 10 and 10 ppm or more of the organic solvent (B) satisfying at least one of 11 or more of the polar term $\delta p$ and 10 or more of the hydrogen bond team $\delta h$.

The resin composition having a low volatile content in one or more embodiments of the present invention is preferably a resin composition which contains 100 parts by weight of the resin and 5 to 70 parts by weight of the core-shell polymer particles, in which the total volatile content in the resin composition is 5000 ppm or less, and which contains 10 ppm or more of the organic solvent (A) and 10 ppm or more of the organic solvent (B) (the resin composition will be hereinafter referred to as a trace solvent mixed resin composition). The lower limit of the amount of the organic solvent (A) contained in the trace solvent mixed resin composition is 10 ppm and preferably 50 ppm, and the upper limit of the amount of the organic solvent (A) is preferably 2000 ppm and more preferably 1500 ppm. The lower limit of the amount of the organic solvent (B) contained in the trace solvent mixed resin composition is 10 ppm and preferably 50 ppm, and the upper limit of the amount of the organic solvent (B) is preferably 4000 ppm, more preferably 3000 ppm, and further preferably 2000 ppm.

The trace solvent mixed resin composition according to one or more embodiments of the present invention contains the same resin as that contained in one or more embodiments of the varnish of the present invention. Examples of the resin include curable or polymerizable monomers, curable or polymerizable oligomers, resins obtained by curing these monomers and oligomers, and thermoplastic polymers. These may be used either alone, or two or more of these may be used in combination. In particular, it is preferable that when the resin is one or more selected from the group consisting of curable or polymerizable monomer, and curable or polymerizable oligomer, and is liquid at ordinary temperature, cured products of various shapes which have excellent toughness can be obtained by curing or polymerizing these resins.

As the curable or polymerizable monomer, or the curable or polymerizable oligomer, an organic compounds containing a functional group having polymerizable or curable reactivity is preferred. As the functional group having polymerizable or curable reactivity, preferred is at least one selected from the group consisting of an epoxy group, an oxetane group, a hydroxyl group, a carbon-carbon double bond, an amino group, an imide group, a carboxylic acid group, a carboxylic acid anhydride group, a cyclic ester group, a cyclic amide group, a benzoxazine group, a cyanate ester group. Among these, compounds having an epoxy group, an oxetane group, a phenolic hydroxyl group, a cyclic ester, a cyanate ester, a benzoxazine group, and/or a carbon-carbon double bond are more preferable in terms of the range of their potential applications as polymerizable/curable resins, and compounds having an epoxy group, so-called epoxy resins, are particularly preferable.

Examples of epoxy resins include glycidyl ether-substituted compounds having a basic skeleton compound such as a bisphenol compound, a hydrogenerated bisphenol compound, a phenol or o-cresol novolac, an aromatic amine, a polycyclic aliphatic or aromatic compound; and compounds having a cyclohexene oxide skeleton. Typically, hisphenol A diglycidyl ether and condensates thereof, so-called bisphenol A epoxy resins, are preferable.

In the trace solvent mixed resin composition according to one or more embodiments of the present invention, the amount of the core-shell polymer particles with respect to 100 parts by weight of the resin is 5 parts by weight to 70 parts by weight, preferably 20 parts by weight to 65 parts by weight, and more preferably 25 parts by weight to 60 parts by weight.

The water concentration in the trace solvent mixed resin composition according to one or more embodiments of the present invention is usually 1% by weight or less, more preferably 0.5% by weight or less, and particularly preferably 0.3% by weight or less.

The organic solvent (A) in the trace solvent mixed resin composition according to one or more embodiments of the present invention is preferably one or more solvents selected from the group consisting of aromatic hydrocarbons such as toluene and xylene; esters such as ethyl acetate and propylene glycol monomethyl ether acetate; and ketones such as acetone, methyl ethyl ketone, methyl isobutyl ketone, and cyclohexanone. The organic solvent (B) is preferably one or more solvents selected from the group consisting of butanol, methyl cellosolve, butyl cellosolve, propylene glycol monomethyl ether, dimethylformamide, dimethylacetamide, dimethyl sulfoxide, and N-methyl-2-pyrrolidone. In the trace solvent mixed resin composition according to one or more embodiments of the present invention, the volume average particle size of the core-shell polymer particles is preferably 10 nm to 500 nm.

The trace solvent mixed resin composition according to one or more embodiments of the present invention can further contain a curing agent, a hardener, a catalyst, a flame retardant, a synergist, an additive, an inert filler, and the like.

The trace solvent mixed resin composition according to one or more embodiments of the present invention can be produced by evaporating the organic solvent (A) and/or the organic solvent (B) from the varnish according to one or more embodiments of the present invention. A method of evaporating the solvent is not particularly limited, and examples thereof include a method of heating and evaporating the mixture under reduced pressure. The conditions of 70° C. or higher and 100 torr or less are preferable in that the solvent can be evaporated in a short time. At this time, an evaporator, an evaporator having an impeller and a heating jacket, a thin film evaporator, or the like can be used.

The trace solvent mixed resin composition according to one or more embodiments of the present invention can suitably be used for molding materials, adhesives, fiber or filler reinforced composite materials, sealing materials, casting materials, insulating materials, coating materials, filling materials, stereolithography materials, optical components, inks, and toners. A dilution obtained by adding an organic solvent to the trace solvent mixed resin composition according to one or more embodiments of the present invention can also be used for the same application.

When the resin is a curable or polymerizable monomer, examples of methods that can be used to mold the trace solvent mixed resin composition according to one or more embodiments of the present invention or a dilution of the composition include transfer molding, injection molding, cast molding, coating and baking, rotary molding, stereolithography, hand lay-up molding using carbon fibers, glass fibers, or the like, prepreg molding, pultrusion, filament winding molding, press molding, resin transfer (RTM or VaRTM), and SMC molding. The present invention is not limited to these methods.

One or more embodiments of the present invention also relate to a cured product of the trace solvent mixed resin composition. The cured product contains core-shell polymer particles dispersed in a matrix formed of a cured resin.

(Purposes)

The solvent composition, varnish, and resin composition having a low volatile content or trace solvent mixed resin composition according to one or more embodiments of the present invention can be suitably used as raw materials for prepregs, copper-clad laminated plates, printed wiring boards, paints (including both solvent-containing and solventless paints composite materials, cast items, and adhesives (including both solvent-containing and solventless adhesives), and can also be used as raw materials for other molding materials, sealing materials, insulating materials, filling materials, stereolithography materials, optical components, inks, and toners. The cast item here is not limited to a metal product, but mainly means a molded article whose matrix is a resin. In particular, they are suitably used for an outermost layer (solder resist) of a printed wiring board, an inner layer of a multilayer printed wiring board (build-up material, prepreg material), or an adhesive for FPC (flexible wiring board).

When they are used as a raw material for a solder resist material, they can be used as a raw material for a printed wiring board (single-sided, double-sided or multilayer printed wiring board), COF, or TAB. When they are used as a raw material for a thermosetting build-up material, they can be used as a raw material for a build-up multilayer wiring board. When they are used as a raw material for a prepreg material, they can be used as a raw material for a build-up multilayer wiring board, a printed wiring board (single-sided, double-sided or multilayer printed wiring board), or a multilayer FPC. When they are used as a raw material for an adhesive for FPC, they can be used as a raw material for an adhesive for three-layer FCCLs (Flexible Copper Clad Laminate) or a coverlay, adhesive, and can be used as a raw material for FPC (single-sided, double-sided or multilayer FPC).

In order to produce a prepreg, after a fiber may be impregnated with the varnish according to one or more embodiments of the present invention, a resin composition having a low volatile content or trace solvent mixed resin composition, or a dilution thereof, the resin contained therein may be semi-cured. The obtained prepreg can be further laminated with a copper foil and cured to produce a copper-clad laminated plate. A printed wiring board can be produced by forming a circuit on the obtained copper-clad laminated plate. In order to produce a composite material, after the varnish according to one or more embodiments of the present invention, a resin composition having a low volatile content or trace solvent mixed resin composition, or a dilution thereof is combined with an inorganic material, the resin contained therein may be cured. In order to produce a cast item, after the varnish according to one or more embodiments of the present invention, a resin composition having a low volatile content or trace sol vent mixed resin composition, or a dilution thereof may be cured into a predetermined shape.

A cured product of an epoxy resin composition in the copper-clad laminated plate according to one or more embodiments of the present invention is preferably a cured product which contains 1 ppm or more of the organic solvent (A) and 1 ppm or more of the organic solvent (B) and has a total volatile content of 100 ppm or less. This cured product preferably contains 3 ppm or more of the organic solvent (A) and 3 ppm or more of the organic solvent (B), and more preferably contains 5 ppm or more of the organic solvent (A) and 5 ppm or more of the organic solvent (B).

A cured product of an epoxy resin composition in the printed wiring board according to one or more embodiments of the present invention is preferably a cured product which contains 1 ppm or more of the organic solvent (A) and 1 ppm or more of the organic solvent (B) and has a total volatile content of 100 ppm or less. This cured product preferably contains 3 ppm or more of the organic solvent (A) and 3 ppm or more of the organic solvent (B), and more preferably contains 5 ppm or more of the organic solvent (A) and 5 ppm or more of the organic solvent (B).

The method for producing the solvent composition according to one or more embodiments of the present invention containing the organic solvent (A) and the organic solvent (B) in a weight ratio of 15:85 to 95:5 may include any two or more of the following steps and preferably includes all steps:

- a step of mixing an aqueous medium dispersion containing the core-shell polymer particles dispersed in an aqueous medium with one or more organic solvents (A) having a polar term δp of a Hansen solubility parameter of less than 11 and a hydrogen bond term δh of less than 10;
- a step of mixing a mixture of the aqueous medium dispersion and the organic solvent (A) with water to obtain a particle loose aggregate;
- a step of separating and collecting the particle loose aggregate from a liquid phase;
- a step of mixing one or more organic solvents (A) having a polar term δp of a Hansen solubility parameter of less than 11 and a hydrogen bond term δh of less than 10 with the particle loose aggregate to obtain a particle dispersion;
- a step of mixing the particle dispersion with one or more organic solvents (B) satisfying at least one of 11 or more of the polar term δp and 10 or more of the hydrogen bond term δh; and
- a step of evaporating one or more substances selected from the group consisting of the organic solvent the organic solvent (B), and water in the obtained mixture.

A varnish, a resin composition, a prepreg, a copper-clad laminated plate, a printed wiring board, a paint, an adhesive, a composite material, or a cast item can be produced by mixing the solvent composition produced by the above method with a resin.

EXAMPLES

Hereinafter, one or more embodiments of the present invention are specifically described with reference to Examples, but the present invention is not limited by these Examples. In addition, reagents from Wako Pure Chemical Industries, Ltd. were used if there is no special regulation.

Table 1 shows the Hansen solubility parameters of solvents used in Examples.

TABLE 1

|  | Solvent species | δ d | δ p | δ h |
|---|---|---|---|---|
| Solvent (A) | Methyl ethyl ketone (MEK) | 16.0 | 9.0 | 5.1 |
|  | Xylene | 17.8 | 1.0 | 3.1 |
|  | Propylene glycol monomethyl ether acetate (PMA) | 15.6 | 5.6 | 9.8 |
| Solvent (B) | Dimethylformamide (DMF) | 17.4 | 13.7 | 11.3 |
|  | Propylene glycol monomethyl ether (PM) | 15.6 | 7.2 | 13.6 |

An analysis measurement method used in one or more embodiments of the present invention will be described below.

[1] Core-Shell Polymer Particle Concentration in Solvent Composition

About 1 g of the solvent composition was weighed precisely and then heated at a set temperature of 120° C. for 30 minutes in a hot air oven. The mass after volatilization of the solvent was measured. The mass after volatilization of the solvent was taken as the mass of the core-shell polymer particles, and this mass was divided by the mass of the solvent composition to calculate a core-shell polymer particle concentration in the solvent composition.

[2] Volume Average Particle Size of Core-Shell Polymer Particles in Solvent Composition The volume average particle size of the core-shell polymer particles contained in the solvent composition was measured with a particle size analyzer (from Nikkiso Co., Ltd., Microtrac UPA). A solvent composition diluted with methyl ethyl ketone was used as a measurement sample. The measurement was carried out in such a manner that the refractive index of methyl ethyl ketone and the refractive index of each of core-shell polymer particles were input, the time of measurement was 600 seconds, and the concentration of the sample was adjusted so that the signal level fell within the range from 0.6 to 0.8.

[3] Solvent Ratio in Solvent Composition

The solvent ratio in the solvent composition was measured by gas chromatography (from Shimadzu Corporation, GC-2014).

[4] Viscosity of Solvent Composition

A container containing the solvent composition was tilted, and the viscosity of the flowing solvent composition was measured at a measurement temperature of 25° C. and a shear rate 1 (1/s) with a spindle CPE-41 by using a digital viscometer model DV-II+Pro from Brookfield. Engineering Laboratories, Inc. If the solvent composition did not flow even when the container was tilted, the solvent composition was evaluated as having high viscosity.

[5] Dielectric Loss Tangent of Core-Shell Polymer Particles

A core-shell polymer particle residue obtained by drying the solvent composition was hot-pressed to produce an evaluation sheet having a size of 100 mm in length×2 mm in width×1 mm in thickness, and the dielectric loss tangent at a frequency of 10 GHz was measured using a cavity resonator device (from KANTO Electronic Application and Development Inc.).

[6] Volatile Content in Epoxy Resin Composition

An epoxy resin composition was heated at 170° C. for 20 minutes, and the volatile content in the epoxy resin composition was measured by comparing the weights before and after heating.

[7] Amount of Solvent in Epoxy Resin Composition

The amount of a solvent in an epoxy resin composition was measured by gas chromatography (from Shimadzu Corporation, GC-2014).

Production Example 1

Production of Core-Shell Polymer Latex

Into a pressure-resistant polymerization machine were charged 200 parts by weight of water, 0.03 parts by weight of tripotassium phosphate, 0.002 parts by weight of ethylenediaminetetraacetic acid disodium salt (EDTA), 0.001 parts by weight of ferrous sulfate heptahydrate and 1.55 parts by weight of sodium dodecylbenzenesulfonate (SDBS). The system was fully purged with nitrogen while stirring to remove oxygen from the system, 100 parts by weight of butadiene (Bd) was charged into the system, and the system was heated to 45° C. To the system were charged 0.03 parts by weight of p-menthane hydroperoxide (PHP) and subsequently 0.10 parts by weight of sodium formaldehydesulfoxylate (SFS), and the polymerization was initiated. On each of the times of 3, 5 and 7 hours after the initiation of the polymerization, 0.025 parts by weight of p-menthane hydroperoxide (PHP) was charged. On each of the times of 4, 6 and 8 hours after the initiation of the polymerization, 0.0006 parts by weight of EDTA and 0.003 pails by weight of ferrous sulfate heptahydrate were charged. On the time of 15 hours after the initiation of the polymerization, remaining monomers were devolatilized and removed under a reduced pressure and the polymerization was terminated, thereby producing a polybutadiene rubber latex (R-1) which contained a polybutadiene rubber as the main component. The volume average particle size of polybutadiene rubber particles contained in the obtained latex was 80 nm.

Into a pressure-resistant polymerization machine were charged 21 parts by weight of the polybutadiene rubber latex (R-1) (which contained 7 parts by weight of a poly butadiene rubber), 185 parts by weight of deionized water, 0.03 parts by weight of tripotassium phosphate, 0.002 parts by weight of EDTA and 0.001 parts by weight of ferrous sulfate heptahydrate. The system was fully purged with nitrogen while stirring to remove oxygen from the system, 93 parts by weight of Bd was then charged into the system, and the system was heated to 45° C. To the system were charged 0.02 parts by weight of PHP and subsequently 0.10 parts by weight of SFS, and the polymerization was initiated. During 24 hours from the initiation of the polymerization, 0.025 parts by weight of PHP, 0.0006 pails by weight of EDTA and 0.003 peals by weight of ferrous sulfate heptahydrate were charged at intervals of three hours. On the time of 30 hours after the initiation of the polymerization, remaining monomers were devolatilized and removed under a reduced pressure and the polymerization was terminated, thereby producing a polybutadiene rubber latex (R-2) which contained a polybutadiene rubber as the main component. The volume average particle size of polybutadiene rubber particles contained in the obtained latex was 200 nm.

Into a glass reactor equipped with a thermometer, a stirrer, a reflux condenser, a nitrogen inlet and an apparatus for adding monomers were charged 241 parts by weight of the polybutadiene rubber latex (R-2) (which contained 80 parts by weight of polybutadiene rubber particles) and 65 parts by weight of water. The resultant system was stirred at 60° C. while being purged with nitrogen. To the system were added 0.004 parts by weight of EDTA, 0.001 parts by weight of ferrous sulfate heptahydrate and 0.2 parts by weight of SFS. Subsequently, a mixture of 2 parts by weight of styrene (St), 12 parts by weight of methyl methacrylate (MMA), 1 part by weight of acrylonitrile (AN), 5 parts by weight of glycidyl methacrylate (GMA) and 0.08 parts by weight of t-butyl hydroperoxide (TBP) was added continuously over 110 minutes. 0.04 parts by weight of TBP was added to the system. The stirring of the system was further continued for 1 hour to complete the polymerization, thereby; producing an aqueous latex (L-1) containing core-shell polymer particles. The volume average particle size of core-shell polymer particles contained in the obtained aqueous latex was 210 nm.

Production Example 2

Into a 100-L pressure-resistant polymerization machine were charged 200 parts by weight of water, 0.03 parts by weight of tripotassium phosphate, 0.25 parts by weight of potassium dihydrogen phosphate, 0.002 parts by weight of ethylenediaminetetraacetic acid, 0.001 parts by weight of ferrous sulfate and 1.5 parts by weight of sodium dodecylbenzenesulfonate. The system was fully purged with nitrogen while stirring to remove oxygen from the system, 75 parts by weight of butadiene and 25 parts by weight of styrene were charged into the system, and the system was heated to 45° C. 0.015 parts by weight of p-menthanehydroperoxide was added and then 0.04 parts by weight of sodium formaldehyde sulfoxylate was added to the polymerization reactor, thereby initiating polymerization. On the time of 4 hours after the initiation of the polymerization, 0.01 parts by weight of p-menthane hydroperoxide, 0.0015 parts by weight of ethylenediaminetetraacetic acid and 0.001 parts by weight of ferrous sulfate were charged. On the time of 10 hours after the initiation of the polymerization, remaining monomers were devolatilized and removed under a reduced pressure and the polymerization was terminated. The resulting styrene-butadiene rubber latex (R-3) had a volume average particle size of 100 nm.

Into a glass reactor equipped with a thermometer, a stirrer, a reflux condenser, a nitrogen inlet and an apparatus for adding monomers were charged 241 parts by weight of the styrene butadiene rubber latex (R-3) (which contained 80 parts by weight of styrene-butadiene rubber particles) and 65 parts by weight of water. The resultant system was stirred at 60° C. while being purged with nitrogen. To the system were added 0.004 parts by weight of EDTA, 0.001 parts by weight of ferrous sulfate heptahydrate and 0.2 parts by weight of SFS. Subsequently, a mixture of 2 parts by weight of St, 12 parts by weight of MMA, 1 part by weight of AN, 5 parts by weight of GMA and 0.08 parts by weight of TBP was added continuously over 110 minutes. 0.04 parts by weight of TBP was added to the system. The stirring of the system was further continued for 1 hour to complete the polymerization, thereby producing an aqueous latex (L-2) containing core-shell polymer particles. The volume average particle size of core-shell polymer particles contained in the obtained aqueous latex was 110 nm.

Production Example 3

Into a glass reactor equipped with a thermometer, a stirrer, a reflux condenser, a nitrogen inlet and an apparatus for adding monomers were charged 241 parts by weight of the styrene-butadiene rubber latex (R-3) (which contained 80 parts by weight of styrene-butadiene rubber particles) and 65 parts by weight of water. The resultant system was stirred at 60° C. while being purged with nitrogen. To the system were added 0.004 parts by weight of EDTA, 0.001 parts by weight of ferrous sulfate heptahydrate and 0.2 parts by weight of SFS. Subsequently, a mixture of 11.7 parts by weight of St, 4.3 parts by weight of AN, 4 parts by weight of GMA and 0.08 pails by weight of IBP was added continuously over 110 minutes, 0.04 parts by weight of TBP was added to the system. The stirring of the system was further continued for 1 hour to complete the polymerization, thereby producing an aqueous latex (L-3) containing core-shell polymer particles. The volume average particle size of core-shell polymer particles contained in the obtained aqueous latex was 110 nm.

Production Example 4

Into a glass reactor equipped with a thermometer, a stirrer, a reflux condenser, a nitrogen inlet and an apparatus for adding monomers were charged 241 parts by weight of the styrene-butadiene rubber latex (R-3) (which contained 80 parts by weight of styrene-butadiene rubber particles) and 65 parts by weight of water. The resultant system was stirred at 60° C. while being purged with nitrogen. To the system were added 0.004 parts by weight of EDTA, 0.001 parts by weight of ferrous sulfate heptahydrate and 0.2 parts by weight of SFS. Subsequently, 2 parts by weight of triallyl isocyanurate (TAW) and 0.07 parts by weight of cumene hydroperoxide (CHP) were added and stirred for 60 minutes. A mixture of 11.7 pails by weight of St, 4.3 parts by weight of AN, 4 parts by weight of GMA and 0.08 parts by weight of TBP was added continuously over 110 minutes. 0.04 parts by weight of TBP was added to the system. The stirring of the system was further continued for 1 hour to complete the polymerization, thereby producing an aqueous latex (L-4) containing core-shell polymer particles. The volume average particle size of core-shell polymer particles contained in the obtained aqueous latex was 110 nm.

Production Example 5

Into a glass reactor equipped with a thermometer, a stirrer, a reflux condenser, a nitrogen inlet and an apparatus for adding monomers and emulsifiers were charged 182 parts by weight of deionized water, 0.006 parts by weight of EDTA, 0.0015 parts by weight of ferrous sulfate heptahydrate, 0.2 parts by weight of SFS and 0.15 parts by weight of SDBS. The mixture was heated to 60° C. while being stirred in a nitrogen stream. Next, a mixture of 75 parts by weight of St, 1.56 parts by weight of allyl methacrylate (ALMA), and 0.024 parts by weight of CHP was continuously added dropwise thereto over 200 minutes. Stirring was continued for 0.5 hours from finishing of the mixture addition to complete the polymerization and an aqueous latex (R-4) containing a crosslinked polymer layer of polymer fine particles was obtained. Subsequently, a mixture of 20 parts by weight of MMA, 5 parts by weight of GMA, and 0.05 parts by weight of CHP was added thereto continuously over 200 minutes. After finishing of the addition, 0.04 parts by weight of CHP was added to the system. The stirring of the system was further continued for 1 hour to complete the polymerization, thereby producing an aqueous latex (L-5) containing core-shell polymer particles. The volume average particle size of core-shell polymer particles contained in the obtained aqueous latex was 122 nm.

Example 1

Into a 1-L mixing vessel having a temperature of 30° C. was charged 126 parts by weight of methyl ethyl ketone (MEK), and was subsequently charged 126 parts by weight of the aqueous latex (L-1) of the core-shell polymer particles while stirring. The system was mixed homogeneously, and then 200 parts by weight of water was charged at a supply rate of 80 parts by weight/min. After the completion of the supply, the stirring was terminated rapidly, thereby producing a slurry solution containing floating core-shell polymer particle loose aggregate.

Subsequently, the core-shell polymer particle loose aggregate was left in the vessel, and 350 parts by weight of the liquid phase was discharged through a discharge port located at the bottom of the vessel. The resultant core-shell polymer particle loose aggregate was further mixed with 150 parts by weight of MEK, thereby producing an MEK dispersion in which core-shell polymer particles were dispersed.

This MEK dispersion was placed in a 1-L vessel (inner diameter: 100 mm) equipped with a jacket and a stirrer (with an impeller 90 mm in diameter having anchor blade), dimethylformamide (DMF) was added such that the core-shell polymer particles/DMF was 30/70 weight ratio, and homogeneously mixed.

Thereafter, the jacket temperature was set at 70° C., and a degree of reduced pressure was set to 200 torr. MEK and water were evaporated until the core-shell polymer particle concentration of the content reached 28% by weight. At this time, a small amount of DMF was also azeotroped.

After MEK was added again in such an amount that the core-shell polymer particle concentration was 11% by weight and homogenously mixed, the jacket temperature was set at 70° C., and the degree of reduced pressure was set to 200 torr. MEK, water and a small amount of DMF were evaporated until the core-shell polymer particle concentration of the content reached 30% by weight. A nitrogen gas was introduced into the vessel to allow the internal pressure to return to atmospheric pressure to obtain a mixed solvent (MEK/DMF) composition of the core-shell polymer particles. Table 2 shows the composition, viscosity, and particle size of the core-shell polymer particles of the obtained solvent composition.

Example 2

A mixed solvent (MEK/DMF) composition of core-shell polymer particles was obtained in the same manner as in Example 1 except that the aqueous latex (L-1) of Example 1 was changed to (L-2). The dielectric loss tangent of the core-shell polymer particles contained in the aqueous latex (L-2) was 0.011. Table 2 shows the composition, viscosity, and particle size of the core-shell polymer particles of the obtained solvent composition.

Example 3

A mixed solvent (MEK/PM) composition of core-shell polymer particles was obtained in the same manner as in Example 1 except that the aqueous latex (L-1) of Example 1 was changed to (L-3), DMF was changed to propylene glycol monomethyl ether (PM), and the core-shell polymer particle concentration of a final solvent composition was 38% by weight. The dielectric loss tangent of the core-shell polymer particles contained in the aqueous latex (L-3) was 0.009. Table 2 shows the composition, viscosity, and particle size of the core-shell polymer particles of the obtained solvent composition.

Example 4

A mixed solvent (MEK/PM) composition of core-shell polymer particles was obtained in the same manner as in Example 1 except that the aqueous latex (L-1) of Example 1 was changed to (L-4), DMF was changed to propylene glycol monomethyl ether (PM), and the core-shell polymer particle concentration of a final solvent composition was 38% by weight. The dielectric loss tangent of the core-shell polymer particles contained in the aqueous latex (L-4) was 0.007. Table 2 shows the composition, viscosity, and particle size of the core-shell polymer particles of the obtained solvent composition.

Example 5

A mixed solvent (MEK/PM) composition of core-shell polymer particles was obtained in the same manner as in Example 1 except that the aqueous latex (L-1) of Example 1 was changed to (L-5), and DMF was changed to propylene glycol monomethyl ether (PM). The dielectric loss tangent of the core-shell polymer particles contained in the aqueous latex (L-5) was 0.005. Table 2 shows the composition, viscosity, and particle size of the core-shell polymer particles of the obtained solvent composition.

Example 6

A mixed solvent (MEK, xylene/PM) composition of core-shell polymer particles was obtained in the same manner as in Example 4 except that PM of Example 4 was changed to a mixed solvent in which xylene/PM=50/50 weight ratio, and the core-shell polymer particle concentration of a final solvent composition was 30% by weight. Table 3 shows the composition, viscosity, and particle size of the core-shell polymer particles of the obtained solvent composition.

Example 7

A mixed solvent (MEK, PMA/PM) composition of core-shell polymer particles was obtained in the same manner as in Example 4 except that PM of Example 4 was changed to a mixed solvent in which propylene glycol monomethyl ether acetate (PMA)/PM=70/30 weight ratio, and the core-shell polymer particle concentration of a final solvent composition was 30% by weight. Table 3 shows the composition, viscosity, and particle size of the core-shell polymer particles of the obtained solvent composition.

Example 8

A mixed solvent (MEK/DMF) composition of core-shell polymer particles was obtained in the same manner as in Example 1 except that the core-shell polymer particle concentration of a final solvent composition was 35% by weight. Table 3 shows the composition, viscosity, and particle size of the core-shell polymer particles of the obtained solvent composition.

Comparative Example 1

A mixed solvent (MEK/DMF) composition of core-shell polymer particles was obtained in the same manner as in Example 1 except that the core-shell polymer particle concentration of a final solvent composition was 41% by weight. Table 4 shows the composition, viscosity, and particle size of the core-shell polymer particles of the obtained solvent composition.

Comparative Example 2

A solvent (MEK) composition of core-shell polymer particles was obtained in the same manner as in Example 1 except that DMF of Example 1 was changed to MEK, the degree of reduced pressure was changed to 350 torr, and the core-shell polymer particle concentration of a final solvent composition was 27% by weight. Table 4 shows the composition, viscosity, and particle size of the core-shell polymer particles of the obtained solvent composition.

Comparative Example 3

A mixed solvent (MEK, PMA) composition of core-shell polymer particles was obtained in the same manner as in Example 1 except that DMF of Example 1 was changed to PMA. Both the solvents in the mixed solvent composition correspond to the organic solvent (A). Table 4 shows the composition, viscosity, and particle size of the core-shell polymer particles of the obtained solvent composition.

Comparative Example 4

Into a 1-L mixing vessel having a temperature of 30° C. was charged 126 parts by weight of methyl ethyl ketone (MEK), and was subsequently charged 126 parts by weight of the aqueous latex (L-3) of the core-shell polymer particles while stirring. The system was mixed homogeneously, and then 200 parts by weight of water was charged at a supply rate of 80 parts by weight/min. After the completion of the supply, the stirring was terminated rapidly, thereby producing a slurry solution containing floating core-shell polymer particle loose aggregate.

Subsequently, the core-shell polymer particle loose aggregate was left in the vessel, and 350 parts by weight of the liquid phase was discharged through a discharge port located at the bottom of the vessel. The resultant core-shell polymer particle loose aggregate was further mixed with 150 parts by weight of MEK, thereby producing a dispersion in which core-shell polymer particles were dispersed.

This dispersion was placed in a 1-L vessel (inner diameter: 100 mm) equipped with a jacket and a stirrer (with an impeller 90 mm in diameter having anchor blade), PM was added such that the core-shell polymer particles/PM was 30/70 weight ratio, and homogeneously mixed.

Thereafter, the jacket temperature was set at 70° C., and a degree of reduced pressure was set to 200 torr. MEK and water were evaporated until the core-shell polymer particle concentration of the content reached 28% by weight. At this time, a small amount of PM was also azeotroped.

After PM was added again in such an amount that the core-shell polymer particle concentration was 11% by weight and homogenously mixed, the jacket temperature was set at 70° C., and the degree of reduced pressure was set to 200 torr. MEK, water and a small amount of PM were evaporated until the core-shell polymer particle concentration of the content reached 30% by weight. A nitrogen gas was introduced into the vessel to allow the internal pressure to return to atmospheric pressure to obtain a mixed solvent (MEK/PM) composition of the core-shell polymer particles. Table 4 shows the composition, viscosity, and particle size of the core-shell polymer particles of the obtained solvent composition.

TABLE 2

|  | Unit | Example 1 | Example 2 | Example 3 | Example 4 | Example 5 |
| --- | --- | --- | --- | --- | --- | --- |
| Type of solvent | — | MEK/DMF | MEK/DMF | MEK/PM | MEK/PM | MEK/PM |
| Solvent (A)/Solvent (B) | Weight ratio | 35/65 | 20/80 | 30/70 | 30/70 | 42/58 |
| Type of core-shell polymer | — | L-1 | L-2 | L-3 | L-4 | L-5 |
| Core-shell polymer particle concentration | wt % | 30 | 30 | 38 | 38 | 30 |
| Volume average particle size | nm | 210 | 110 | 110 | 110 | 125 |
| Viscosity | mPa · s | 0 | 0 | 4500 | 3700 | 0 |

TABLE 3

|  | Unit | Example 6 | Example 7 | Example 8 |
|---|---|---|---|---|
| Type of solvent | — | MEK, Xylene/PM | MEK, PMA/PM | MEK/DMF |
| Solvent (A)/solvent (B) | Weight ratio | 31/69 | 90/10 | 20/80 |
| Type of core-shell polymer | — | L-4 | L-4 | L-1 |
| Core-shell polymer particle concentration | wt % | 30 | 30 | 35 |
| Volume average particle size | nm | 110 | 110 | 100 |
| Viscosity | mPa · s | 200 | 4000 | 0 |

TABLE 4

|  | Unit | Comparative Example 1 | Comparative Example 2 | Comparative Example 3 | Comparitive Example 4 |
|---|---|---|---|---|---|
| Type of solvent | — | MEK/DMF | MEK | MEK, PMA | MEK/PM |
| Solvent (A)/solvent (B) | Weight ratio | 20/80 | 100/0 | 100/0 | 14/86 |
| Type of core-shell polymer | — | L-1 | L-1 | L-1 | L-4 |
| Core-shell polymer particle concentration | wt % | 41 | 27 | 30 | 30 |
| Volume average particle size | nm | 100 | 100 | 100 | 110 |
| Viscosity | mPa · s | 20000 | 5100 | 7900 | High viscosity |

As described above, in Examples 1 to 8, it can be seen that various core-shell polymer particles contained in the aqueous latexes (L-1) to (L-5) were dispersed at a high concentration of 30% by weight or more, and a low viscosity solvent composition was obtained.

Further the core-shell polymer particles contained in the aqueous latex (L-3) had a higher styrene content in the shell layer and a lower dielectric loss tangent value than the core-shell polymer particles contained in the aqueous latex (L-2). In addition, the core-shell polymer particles contained in the aqueous latex (L-4) contain styrene also in the core layer, and the core-shell polymer particles contained in the aqueous latex (L-5) have a core layer formed of crosslinked styrene. These core-shell polymer particles contained more styrene than the core-shell polymer particles contained in the aqueous latex (L-3), and exhibited a lower dielectric loss tangent value. A low dielectric loss tangent can contribute to suppression of transmission loss of a printed wiring board that handles high-frequency signals.

The solvent composition of Comparative Example 1 had a core-shell polymer particle concentration exceeding 40% by weight, had a high viscosity, and was difficult to handle. The solvent compositions of Comparative Examples 2 and 3 do not contain the organic solvent (B), and it can be seen that the viscosity is high even when the particle concentration is low, as compared with Examples 1 and 8. The solvent composition of Comparative Example 4 contains a large amount of the organic solvent (B) as a solvent, and since the organic solvent (B) has low affinity with the core-shell polymer particles, the solvent composition is greatly thickened, and the viscosity becomes so high that it does not flow even when a container is tilted.

[Evaluation With Copper-Clad Laminated Plate]
(7) Evaluation of Toughness of Copper-Clad Laminated Plate An epoxy resin (Epicron 153-60M from DIC Corporation), a curing agent (Phenolite TD-2090-60M from DIC Corporation), a curing accelerator (Curazole 2E4MZ from Shikoku Chemicals Corporation), the solvent composition obtained in Example 4 or 5, and fused silica (Admatine from Admatechs, 1.5 µm) were mixed at a blending ratio shown in Table 5 to obtain a varnish. This varnish was impregnated into a Style 7628, E-glass fabric and dried at 140° C. for 5 minutes to obtain a prepreg. Eight sheets of the prepreg were stacked, and 35 µm thick copper foils were situated on both sides of the laminate. A laminate obtained by sandwiching a 2 cm long and 50 µm thick Teflon (registered trademark) sheet at a corner on the fourth prepreg was pressed at a pressure of 3 MPa and 190° C. for 60 minutes to obtain a copper-clad laminated plate having a width of 20 mm, a length of 100 mm, and a thickness of 1.7 mm. As the toughness evaluation, interlaminar fracture toughness Glc of the copper-clad laminated plate was measured according to JIS K 762.8.

(8) Evaluation of Flexural Modulus of Copper-Clad Laminated Plate

The copper-clad laminated plate was used, and the flexural modulus of the copper-clad laminated plate was measured according to JIS K 7017.

Examples 9 and 10 and Comparative Example

Table 5 shows the evaluation results of the interlaminar fracture toughness Glc and the flexural modulus of the copper-clad laminated plate Obtained by using the solvent composition obtained in Example 4 or 5 or without using the solvent composition.

TABLE 5

|  | Unit | Example 9 | Example 10 | Comparative Example 5 |
|---|---|---|---|---|
| Epoxy resin | Part(s) by weight | 51.5 | 51.5 | 55 |
| Curing agent | Part(s) by weight | 13.5 | 13.5 | 15 |
| Curing accelerator | — | Catalyst amount | Catalyst amount | Catalyst amount |

TABLE 5-continued

| | Unit | Example 9 | Example 10 | Comparative Example 5 |
|---|---|---|---|---|
| Core-shell polymer particle (Example within parentheses shows type) | Part(s) by weight | 5 (Example 4) | 5 (Example 5) | 0 |
| Fused silica | Part(s) by weight | 30 | 30 | 30 |
| Interlaminar fracture toughness G1c | kJ/m$^2$ | 0.13 | 0.11 | 0.073 |
| Flexural modulus | GPa | 17 | 18 | 18 |

The term "parts by weight" means a value as a solid content.

In Examples 9 and 10, it can be seen that the interlaminar fracture toughness of the copper-clad laminated plate was improved as compared with Comparative Example 5. The improvement in the interlaminar fracture toughness can contribute to suppression of defects such as cracks and delamination, and suppression of wear and breakage of drill bits in drilling for forming a through hole in the laminated plate. In Example 9, the flexural modulus slightly decreased as compared with Comparative Example 5, whereas in Example 10 containing core-shell polymer particles of a hard core layer, it was found that the interlaminar fracture toughness was improved while the flexural modulus was kept high.

Example 11

A liquid bisphenol A-type epoxy resin "jER 828EL" (a product name, Mitsubishi Chemical Corporation) was added to the solvent composition obtained in Example 1 in such a manner that the core-shell polymer particles/the epoxy resin became 25/75 weight ratio followed by mixing, and then the organic solvent was distilled away under reduced pressure at 80° C. and 1 torr, thereby producing an epoxy resin composition. The volatile content in the epoxy resin composition was 4700 ppm, and the remaining MEK and DMF were 200 ppm and 3500 ppm, respectively.

Example 12

An epoxy resin composition was obtained in the same manner as in Example 11 except that the solvent composition obtained in Example 4 was used instead of the solvent composition obtained in Example 1. The volatile content in the epoxy resin composition was 2800 ppm, and the remaining MEK and PM were 300 ppm and 650 ppm, respectively.

What is claimed is:

1. A solvent composition comprising:
   an organic solvent comprising one or more organic solvents (A) and one or more organic solvents (B); and
   one or more types of core-shell polymer particles each comprising a core layer and a shell layer 1, wherein the core layer of the core-shell polymer particles includes:
      (i) a rubber elastic body formed from 50 to 100% by weight of one or more monomers selected from the group consisting of diene monomers and (meth) acrylic ester monomer and less than 50% by weight of other copolymerizable vinyl monomer,
      (ii) a polysiloxane rubber-based elastic body,
      (iii) an aromatic vinyl crosslinked body, or
      (iv) a mixture of two of more of (i) to (iii), and
   wherein the other copolymerizable vinyl monomer is one or more selected from the group consisting of an aromatic vinyl compound, a vinyl cyanide compound, an unsaturated carboxylic acid derivative, a (meth) acrylic acid amide derivative, and a maleimide derivative,
   wherein the one or more organic solvents (A) have a polar term δp of a Hansen solubility parameter of less than 11 and a hydrogen bond term δh of less than 10,
   wherein the one or more organic solvents (B) satisfy at least one of: 11 or more of the polar δp; or 10 or more of the hydrogen bond term δh,
   wherein a weight ratio of the one or more organic solvents (A) to the one or more organic solvents (B) ranges from 15:85 to 95:5, and
   wherein, based on a total weight of the solvent composition, a content of the core-shell polymer particles is 20 to 40% by weight and a water content is 1% by weight or less.

2. The solvent composition according to claim 1, wherein the organic solvent (A) is one or more solvents selected from the group consisting of toluene, xylene, ethyl acetate, propylene glucol monomethyl ether acetate, acetone, methyl ethyl ketone, methyl isobutyl ketone, and cyclohexanone, and
   the organic solvent (B) is one or more solvents selected from the group consisting of butanol, methyl cellosolve, butyl cellosolve, propylene glycol monomethyl ether, dimethylformamide, dimethyl acetamides, dimethyl sulfoxide, and N-methyl-2-pyrrolidone.

3. The solvent composition according to claim 1, wherein the core-shell polymer particles in the solvent composition have a volume average particle size of 10 nm to 500 nm.

4. The solvent composition according to claim 1, wherein 30% by weight or more of the core-shell polymer particles is formed of styrene.

5. The solvent composition according to claim 1, wherein the core-shell polymer particles are copolymerized with 0.2 to 7 by weight of a crosslinkable monomer in 100% by weight of the core-shell polymer particles.

6. A varnish comprising a resin and the solvent composition according to claim 1.

7. A method for producing a prepreg, the method comprising:
   mixing a resin with the solvent composition according to claim 1;
   impregnating a fiber with a composition containing the resin and the core-shell polymer particles; and
   semi-curing the resin.

8. A method for producing a copper-clad laminated plate, the method comprising:
   mixing a resin with the solvent composition according to claim 1;
   impregnating a fiber with a composition containing the resin and the core-shell polymer particles;
   semi-curing the resin to obtain a prepreg; and laminating the prepreg and a copper foil and caring the prepreg.

9. A method for producing a printed wiring board, the method comprising:
mixing a resin with the solvent composition according to claim 1;
impregnating a fiber with a composition containing the resin and the core-shell polymer particles;
semi-curing the resin to obtain a prepreg;
laminating the prepreg and a copper foil and curing the prepreg to obtain a copper-clad laminated plate; and
forming a circuit on the copper-clad laminated plate.

10. A method for producing a solvent composition according to claim 1, the method comprising:
mixing an aqueous medium dispersion containing core-shell polymer particles dispersed in an aqueous medium with one or more organic solvents (A) having a polar term $\delta p$ of a Hansen solubility parameter of less than 11 and a hydrogen bond term $\delta h$ of less than 10;
mixing a mixture of the aqueous medium dispersion and the organic solvent with water to obtain a particle loose aggregate;
separating and collecting the particle loose aggregate from a liquid phase;
mixing one or more organic solvents (A) having a polar term $\delta p$ of a Hansen solubility parameter of less than 11 and a hydrogen bond term $\delta h$ of less than 10 with the particle loos aggregate to obtain a particle dispersion;
mixing the particle dispersion with one or more organic solvents (B) satisfying at least one of: 11 or more of the polar term $\delta p$; or 10 or more of the hydrogen bond term $\delta h$; and
evaporating one or more substances selected from the group consisting of the organic solvent (A), the organic solvent (B), and water in the obtained mixture, wherein the organic solvent (A) and the organic solvent (B) are contained in a weight ratio of 15:85 to 95:5, and a content of the core-shell polymer particles is 20 to 40% by weight based on a total weight of the solvent composition.

11. A method for producing a varnish, the method comprising producing a solvent composition by the method according to claim 10 and then mixing a resin and the solvent composition.

12. A method for producing a resin composition, the method comprising producing a varnish by the method according to claim 11 and then evaporating the organic solvent (A) and/or the organic solvent (B) from the varnish.

13. The solvent composition according to claim 1, wherein a total content of the organic solvent is 60 to 80% by weight based on the total weight of the solvent composition.

14. The solvent composition according to claim 1, wherein a polymer constituting the shell layer of the core-shell polymer particles is a (co)polymer obtained by polymerizing one or more selected from (meth)acrylic ester monomers, aromatic vinyl monomers, vinyl cyanide monomers, unsaturated carboxylic acid derivatives, (meth)acrylamide.

* * * * *